United States Patent
Takashima et al.

(10) Patent No.: US 8,216,858 B2
(45) Date of Patent: Jul. 10, 2012

(54) FERROELECTRIC MATERIAL, METHOD OF PRODUCING FERROELECTRIC MATERIAL, AND FERROELECTRIC DEVICE

(75) Inventors: Kenji Takashima, Saitama (JP);
Makoto Kubota, Yokohama (JP);
Soichiro Okamura, Tokyo (JP);
Takashi Nakajima, Tokyo (JP);
Tomosato Okubo, Fujimino (JP);
Yosuke Inoue, Tokyo (JP)

(73) Assignees: Canon Kabushiki Kaisha, Tokyo (JP);
Tokyo University of Science Educational Foundation Administrative Organization, Tokyo (JP)

(*) Notice: Subject to any disclaimer, the term of this patent is extended or adjusted under 35 U.S.C. 154(b) by 333 days.

(21) Appl. No.: 12/700,381

(22) Filed: Feb. 4, 2010

(65) Prior Publication Data
US 2010/0208412 A1 Aug. 19, 2010

(30) Foreign Application Priority Data
Feb. 18, 2009 (JP) ................................. 2009-035839

(51) Int. Cl.
*B05D 5/12* (2006.01)
*C01G 29/00* (2006.01)
*C01G 49/02* (2006.01)

(52) U.S. Cl. ...... 438/3; 257/295; 252/62.9 R; 427/126.6

(58) Field of Classification Search .............. 252/62.3 T, 252/62.9 R, 521.2; 423/594.1, 594.7; 427/126.6; 438/3; 257/295; 310/311; 361/322
See application file for complete search history.

(56) References Cited

U.S. PATENT DOCUMENTS

| 2009/0315432 A1 | 12/2009 | Furuta et al. |
| 2010/0025617 A1 | 2/2010 | Kubota et al. |
| 2010/0025618 A1 | 2/2010 | Watanabe et al. |
| 2011/0221302 A1 | 9/2011 | Yabuta et al. |

FOREIGN PATENT DOCUMENTS

| JP | 2007-221066 A | 8/2007 |
| JP | 2007-287739 A | 11/2007 |

OTHER PUBLICATIONS

Naganuma et al "Ferroelectric, electrical and magentic properties of Cr, Mn, Co, Ni, Cu added polycrystalline BiFeO3 films", Applied Phys. Lett 93, 052901-1-3, 2008.*
Kumar et al "Rapid liquid phase sintering Mn doped BiFeO3 ceramics with enhanced polarization and weak magnetization", Applied Phys Lett 91, 242901-1-3, 2007.*

* cited by examiner

*Primary Examiner* — Mark Kopec
(74) *Attorney, Agent, or Firm* — Fitzpatrick, Cella, Harper & Scinto

(57) ABSTRACT

Provided are a ferroelectric material having good ferroelectricity and good insulation property, and a ferroelectric device using the ferroelectric material. In the present invention, the ferroelectric material includes a metal oxide having a perovskite-type crystal structure, in which: the metal oxide contains bismuth ferrite whose iron is substituted by manganese, and at least one of a copper oxide and a nickel oxide; the bismuth ferrite is substituted by manganese at a substitution ratio of 0.5 at. % or more to 20 at. % or less with respect to a total amount of iron and manganese; and at least one of the copper oxide and the nickel oxide is added in an amount of 0.5 mol % or more to 20 mol % or less with respect to the bismuth ferrite whose iron is substituted by manganese.

13 Claims, 1 Drawing Sheet

FERROELECTRIC MATERIAL, METHOD OF PRODUCING FERROELECTRIC MATERIAL, AND FERROELECTRIC DEVICE

BACKGROUND OF THE INVENTION

1. Field of the Invention

The present invention relates to a ferroelectric material, a ferroelectric thin film, a method of producing a ferroelectric thin film, and a ferroelectric device, in particular, a novel ferroelectric material formed of a lead-free metal oxide.

2. Description of the Related Art

A ferroelectric device is typically formed of a lower electrode and an upper electrode, and a film-shaped ferroelectric material interposed between these electrodes. As a ferroelectric material, lead-type ceramics such as lead zirconate titanate (hereinafter, referred to as "PZT") is generally used.

However, PZT contains lead as an A-site element, and hence its effect on an environment is considered as a problem. Therefore, a ferroelectric material using a lead-free perovskite-type metal oxide has been proposed.

For example, a ferroelectric material mainly formed of bismuth ferrite, i.e., $BiFeO_3$ (hereinafter referred to as "BFO") has been proposed as a ferroelectric formed of a lead-free perovskite-type metal oxide.

For example, Japanese Patent Application No. 2007-287739 discloses a BFO-based material containing lanthanum at its A-site. BFO is a good ferroelectric material, and it has been reported that the remanent polarization amount of BFO measured at a low temperature is high. However, BFO involves the following problems. That is, a voltage to be applied to BFO cannot be increased owing to low insulation property of BFO, and BFO is hard to use under a room-temperature environment.

In view of the foregoing, Japanese Patent Application No. 2007-221066 proposes a method of suppressing an increase in leak current, the method involving substituting iron as the B-site element of BFO with manganese to improve the insulation property. However, BFO in which iron atoms are partially substituted by manganese has a problem in that its performance as a ferroelectric is worsened.

SUMMARY OF THE INVENTION

The present invention has been made for dealing with such problems, and provides a ferroelectric material having good ferroelectricity and good insulation property.

In addition, the present invention provides a ferroelectric thin film formed of the above ferroelectric material, a method of producing a ferroelectric thin film, and a ferroelectric device.

A ferroelectric material of the present invention for solving the above-mentioned problems is formed of a metal oxide in which: the metal oxide contains bismuth ferrite in which iron is substituted by manganese, and at least one of a copper oxide and a nickel oxide; the bismuth ferrite is substituted by manganese at a ratio of 0.5 at. % (atomic percent) or more to 20 at. % or less with respect to the total amount of iron and manganese; and at least one of the copper oxide and the nickel oxide is added in an amount of 0.5 mol % or more to 20 mol % or less with respect to the bismuth ferrite in which iron is substituted by manganese.

According to the present invention, there can be provided a ferroelectric material having good ferroelectricity and good insulation property.

In addition, according to the present invention, there can be provided a ferroelectric thin film formed of the above ferroelectric material, a method of producing a ferroelectric thin film, and a ferroelectric device.

Further, the ferroelectric material of the present invention has no influence on an environment because the material does not use lead. In addition, the material is advantageous in terms of durability when used in a ferroelectric device because the material does not use any alkali metal.

Further features of the present invention will become apparent from the following description of exemplary embodiments with reference to the attached drawings.

DESCRIPTION OF THE EMBODIMENTS

Figure 1:
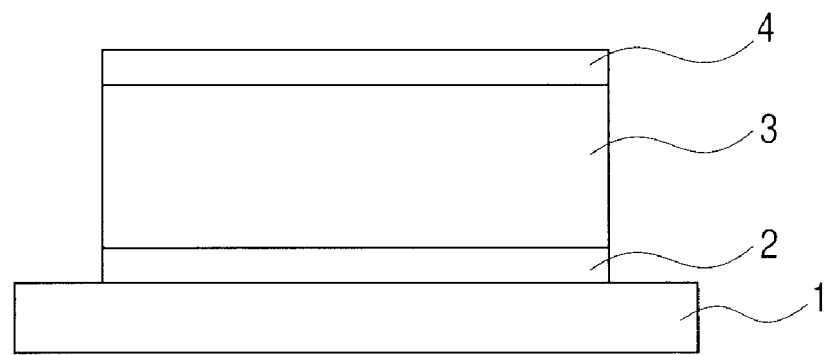
FIG. 1 is a longitudinal schematic sectional view illustrating an example of an embodiment of a ferroelectric device of the present invention.

Hereinafter, an embodiment for carrying out the present invention is described.

The present invention provides a novel ferroelectric material having good insulation property and good ferroelectricity, based on bismuth ferrite.

A ferroelectric material according to the present invention is a ferroelectric material formed of a metal oxide having a perovskite-type crystal structure, the ferroelectric material being characterized in that: the metal oxide contains bismuth ferrite in which iron atoms are partially substituted by manganese, and at least one of a copper oxide and a nickel oxide; the bismuth ferrite is substituted by manganese at a ratio of 0.5 at. % or more to 20 at. % or less with respect to the total amount of iron and manganese; and at least one of the copper oxide and the nickel oxide is added in an amount of 0.5 mol % or more to 20 mol % or less with respect to the bismuth ferrite in which iron atoms are partially substituted by manganese.

In the present invention, the term "bismuth ferrite" stands for a composite oxide in which bismuth and iron are in a state of a solid-solution and is also referred to as "bismuth iron oxide". In particular, bismuth ferrite having a perovskite-type crystal structure is represented by the general formula $BiFeO_3$.

The term "mol %" in the present invention is used for representing how many moles of CuO or NiO are added with respect to 1 mole of the bismuth ferrite in which iron atoms are partially substituted by manganese.

For example, a metal oxide having composition "Bi/Fe/Mn/Cu=1.00/0.97/0.03/0.03 (mole)" of Example 1 is represented by a chemical formula "$BiFe_{0.97}Mn_{0.03}O_3+0.03CuO$" The part "+0.03CuO" means that CuO is added at a ratio of 0.03 mole with respect to 1 mole of $BiFe_{0.97}Mn_{0.03}O_3$.

The metal oxide having a perovskite-type crystal structure is generally represented by a chemical formula "$ABO_3$." The elements A and B in the perovskite-type metal oxide each act in the form of an ion to occupy a specific position of a unit cell called an A-site or a B-site. In the case of, for example, a unit cell of a cubic crystal system, the element A is positioned at a vertex of a cube, and the element B is positioned at the body center of the cube. The O elements act as oxygen anions to occupy face-centered positions.

In the bismuth ferrite, bismuth is a metal element positioned mainly at the A-site, and iron is an element positioned mainly at the B-site.

The number of metals occupying the A-site and the number of metals occupying the B-site are ideally identical to each other. When the number of A-site metals is excessive or deficient as compared to the number of B-site metals, the excessive metals are precipitated at a crystal grain boundary or the deficient content causes a defective site. As a result, for example, the insulation property may be adversely affected. An allowable range for a molar ratio of a metal amount at the A-site to that at the B-site "A-site/B-site" is, for example, 0.95 or more to 1.20 or less. When the metal amounts at the A- and B-sites deviate from the range, not only the insulation property but also the ferroelectricity significantly reduces.

The metal oxide of the present invention shows the ferroelectricity by using the bismuth ferrite as a main component. The term "main component" as used herein refers to a component having the largest weight, the component accounting for such an abundance that the main property is not lost. For example, the content of the bismuth ferrite in the metal oxide is 51 wt % or more to 100 wt % or less.

The metal oxide of the present invention is such that part of iron atoms of which the bismuth ferrite as its main component is formed are substituted by manganese. The substitution suppresses the amount of a current leaking from the bismuth ferrite.

The term "substitution" as used herein refers to a state where an element in a lattice forming a crystal lattice is replaced with another element in an amount equal to that of the element so that the other element may form the crystal lattice. That is, in the present invention, a large amount of iron and a small amount of manganese occupy the B-site of the bismuth ferrite as a base. However, an effect of the present invention can be obtained even when not all manganese atoms in the metal oxide position at the B-site.

When part of iron atoms in the bismuth ferrite are substituted by manganese, the volume of the unit cell changes. Accordingly, whether the substitution occurred can be determined by an approach by which a lattice length can be specified such as X-ray diffraction measurement (XRD). In addition, the presence and content of manganese in the metal oxide can be confirmed by an elemental analysis approach such as energy dispersive X-ray spectroscopy (EDX), X-ray fluorescence analysis (XRF), or ICP emission spectrophotometer.

Unsubstituted bismuth ferrite involves the following problems. That is, its insulation property reduces as the intensity of an applied electric field increases. In addition, the unsubstituted bismuth ferrite involves the following problem. That is, its insulation property is low at around room temperature that is an industrially practical temperature. In view of the foregoing, in the present invention, part of iron atoms are substituted by manganese because an improving effect on the insulation property can be obtained as a result of the densification of crystal grains and the compensation of oxygen deficiencies.

In the present invention, the bismuth ferrite in the metal oxide is substituted by manganese at a substitution ratio of 0.5 at. % or more to 20 at. % or less, or preferably 1 at. % or more to 5 at. % or less with respect to the total amount of iron and manganese. When the substitution ratio is less than 0.5 at. %, the improving effect on the insulation property cannot be sufficiently obtained. On the other hand, when the substitution ratio exceeds 20 at. %, a perovskite skeleton cannot be maintained, and hence the ferroelectricity may be lost.

Further, when the substitution ratio of manganese is 1 at. % or more to 5 at. % or less, the insulation property of the ferroelectric material of the present invention can be significantly improved without any considerable impairment of the ferroelectricity inherent in the bismuth ferrite.

At least one of the copper oxide and the nickel oxide is incorporated into the metal oxide in the present invention by addition.

The term "addition" as used herein means not the substitution of the crystal lattice of the bismuth ferrite as a base by copper or nickel but the inclusion of copper or nickel in the state of an independent oxide or oxide ion in the ferroelectric material of the present invention. The oxide of copper or nickel added may be present mainly at the crystal grain boundary of the bismuth ferrite. It should be noted that the effect of the present invention can be obtained even when part of the molecules of the oxide of copper or nickel added are included in the crystal lattice of the bismuth ferrite.

A state where most of the molecules of the oxide of copper or nickel added are present at the crystal grain boundary without substituting for the site can be confirmed by the fact that the lattice length of a crystal does not change irrespective of whether the addition was performed. The lattice length of the crystal can be derived by, for example, XRD. Alternatively, the state can be confirmed by the fact that the electron states of bismuth and iron of which the crystal lattice is formed do not change irrespective of whether the addition was performed. The electron states of bismuth and iron can be confirmed by the bond energies of the respective metals obtained by X-ray photoelectron spectroscopy (XPS).

In addition, the addition amount of the oxide of copper or nickel with respect to the metal oxide can be determined by, for example, EDX, XRF, or ICP emission spectrophotometer.

The addition of at least one of the copper oxide and the nickel oxide to the metal oxide in the present invention provides the effect that a reduction in remanent polarization caused by the substitution by manganese is compensated. That is, compatibility between the insulation property and the ferroelectricity is achieved. Although a mechanism for the effect is unclear, the following hypothesis has been made.

That is, the following mechanism is conceivable. When part of the iron atoms of the bismuth ferrite are substituted by manganese, the respective crystal grains are densified and brought close to each other. As a result, the insulation property of the entire material is improved, but a binding energy between the crystal grains also increases. Accordingly, polarization does not easily proceed with an external electric field, and hence a problem such as the reduction in remanent polarization or an increase in coercive electric field occurs. In view of the foregoing, when an ion or oxide of at least one of copper and nickel is caused to exist at a crystal grain boundary as in the present invention, excessive densification of the crystal grains can be suppressed. In addition, the oxide at the grain boundary serves to hold and transfer charge, and hence polarizability more excellent than that in a state where the addition is not performed can be obtained.

In the present invention, at least one of the copper oxide and the nickel oxide in the metal oxide is added in an amount of 0.5 mol % or more to 20 mol % or less, or preferably 1 mol % or more to 5 mol % or less, with respect to the bismuth ferrite in which iron is substituted by manganese. The term "bismuth ferrite" as used herein refers to bismuth ferrite in which iron atoms are partially substituted by manganese. When the addition amount of the oxide accounts for less than 0.5 mol %, ferroelectricity cannot be sufficiently improved. On the other hand, when the addition amount accounts for more than 20 mol %, the amount of the copper component or nickel component with which the crystal lattice of the bismuth ferrite is substituted increases, thereby reducing the insulation property.

Further, the addition amount of at least one of the copper oxide and the nickel oxide preferably accounts for 1 mol % or more to 5 mol % or less because the oxide is effectively positioned at the grain boundary of the bismuth ferrite.

Further, manganese by which iron is substituted preferably contains tetravalent manganese.

A state where ionic charge is trivalent ($Fe^{3+}$) and a state where ionic charge is divalent ($Fe^{2+}$) coexist in iron of which the bismuth ferrite is formed. The substitution of iron by tetravalent manganese having larger ionic charge than that of iron can suppress a current leak resulting from oxygen deficiencies. Whether manganese by which iron is substituted contains tetravalent manganese can be determined through the analysis of a bond energy by XPS.

Further, the metal oxide is preferably a polycrystal.

The effect of the present invention may be obtained as a result of the precipitation of the copper oxide or nickel oxide having a small particle diameter at the grain boundary of the bismuth ferrite substituted by manganese. Accordingly, the effect of the present invention is sufficiently expressed in the polycrystal having a uniform grain boundary at which the oxide is to be precipitated.

Next, a ferroelectric thin film of the present invention is described.

The ferroelectric thin film according to the present invention is characterized by being formed of the above ferroelectric material. The ferroelectric thin film is a thin film using a ferroelectric material formed of a metal oxide having a perovskite-type crystal structure as a main component, the thin film being characterized in that: the metal oxide is mainly formed of bismuth ferrite; part of the iron atoms of the metal oxide are substituted by manganese; and at least one of a copper oxide and a nickel oxide is added to the metal oxide. The term "thin film" as used herein refers to, for example, a film having a thickness of 100 μm or less. The thin film may be in such a form as to cover one surface of a substrate, or may be in such a form that the ferroelectric material independently aggregate in a foil fashion. Further, the thickness of the ferroelectric thin film is desirably 50 nm or more to 4,000 nm or less, or more preferably 100 nm or more to 1,000 nm or less.

Further, the average particle diameter of crystal grains when the ferroelectric thin film is observed from its film surface is desirably 50 nm or more to 120 nm or less, or preferably 50 nm or more to 90 nm or less. When the average particle diameter of the crystal grains is less than 50 nm, sufficient ferroelectricity cannot be obtained owing to reductions in sizes of the crystal grains. On the other hand, when the average particle diameter of the crystal grains exceeds 200 nm, fine processability reduces owing to the crystal grains that have been made excessively coarse. In addition, the insulation property also reduces owing to an enlarged width of a grain boundary.

The average particle diameter can be calculated from a surface image obtained with, for example, a scanning electron microscope (SEM), a transmission electron microscope (TEM), or an atomic force microscope (AFM). For example, the diameter of a perfect circle having the same area as that of the projected area of a crystal grain (projected area circle-equivalent diameter) obtained by using an image processing software for a microphotographic image photographed at a magnification of about 20,000 to 50,000 can be used as the average particle diameter.

When the shape of the film is not flat, and hence the thickness cannot be determined to be a unique value, the average of thicknesses between two electrodes substantially functioning as a ferroelectric material upon production of a device has only to be caused to fall within the above range. The setting of the thickness of the ferroelectric thin film of the present invention to 50 nm or more provides a polarization amount needed for a ferroelectric device. In addition, an increase in density of the thin film upon production of a device can be expected from the setting of the thickness to 1,000 nm or less. In addition, the effect of the present invention enlarges in the above thickness range.

Next, a method of producing a ferroelectric thin film of the present invention is described.

The method of producing a ferroelectric thin film according to the present invention is characterized by including forming the ferroelectric thin film with a mixed solution of the metal salts of bismuth, iron, manganese, and at least one of copper and nickel by a chemical solution deposition method. There is no particular limit to the method of producing a thin film in order to achieve the characteristics of the present invention. Examples of the method include a chemical solution deposition method (CSD method), a metal organic chemical vapor deposition method (MOCVD method), a sputtering method, a pulse laser deposition method (PLD method), a hydrothermal synthesis method, and an aerosol deposition method (AD method).

Of those, the most preferred lamination method is the chemical solution deposition method (CSD method). The chemical solution deposition method in the present invention collectively refers to a film formation method of obtaining intended metal oxides by applying a precursor solution of the intended metal oxides onto a substrate, followed by heating and crystallization. Generally, film formation methods called a chemical solution deposition method, a sol-gel method, and an organic metal decomposition method are hereinafter collectively referred to as a CSD method. The CSD method is a film formation method excellent in precisely controlling a metal composition.

Examples of a precursor of a metal compound to be used in the chemical solution deposition methods include a hydrolyzable or thermally degradable metal organic compound. Of those, a salt-like metal compound is preferably used as the precursor in the present invention. The use of the metal salts in the mixed solution to be applied uniformizes the rates at which the dissimilar metals are precipitated on a substrate by virtue of a small difference in solubility between the metals. As a result, a uniform ferroelectric thin film can be obtained.

That is, the ferroelectric thin film according to the present invention is preferably formed by a chemical solution deposition method involving the use of the mixed solution of the metal salts of bismuth, iron, manganese, and copper or nickel.

Further, when the metal salts are 2-ethylhexanoates, a hydrolysis reaction between the metals easily proceeds. As a result, a uniform ferroelectric thin film having a high density can be obtained.

Further, a difference between the total amount of iron and manganese in the mixed solution of the metal salts and the content of bismuth in the solution is preferably 1 at. % or less. In other words, the foregoing intends to make the loading amount of bismuth to be positioned at the A-site of a perovskite crystal lattice and the loading amount of iron and manganese to be positioned at the B-site of the cell comparable to each other. Doing so improves the accuracy with which substitution for the ferroelectric thin film to be finally obtained is performed. This is attributable to the following characteristic of the CSD method. That is, a metal atom arrangement in an intermediate state before the crystallization of the thin film affects a metal atom arrangement after the crystallization.

Further, it is more preferred for the method of producing a ferroelectric thin film of the present invention that the chemical solution deposition method be performed on the basis of multi-layer coating, and a coating thickness per layer be 10 nm or more to 50 nm or less. The term "multi-layer" refers to 2 or more to 400 or less layers, or preferably 2 to 100 layers. The microstructure of the metal oxide thin film obtained by the CSD method is largely affected by the coating thickness per layer. In the present invention, when a film having a stack structure is provided by setting the coating thickness within the above range, the film becomes of such quality as to be dense and uniform, and an additionally large effect of each of the substitution and the addition can be obtained.

In the method of producing a ferroelectric thin film of the present invention, the mixed solution uses the respective metal salts of bismuth, iron, manganese, and at least one of copper and nickel. Accordingly, a ratio of each metal can be easily adjusted.

Next, a ferroelectric device of the present invention is described.

The ferroelectric device according to the present invention is a ferroelectric device having, on a substrate, a ferroelectric thin film and a pair of electrodes provided so as to contact the ferroelectric thin film, the device being characterized in that the ferroelectric thin film is the above ferroelectric thin film.

FIG. 1 is a longitudinal schematic sectional view illustrating an example of an embodiment of the ferroelectric device according to the present invention. In the figure, reference numeral 1 represents the substrate, reference numeral 2 represents a lower electrode, reference numeral 3 represents the ferroelectric thin film, and reference numeral 4 represents an upper electrode.

Although there is no particular limit to a material for the substrate 1, a material that is not deformed or melted during a sintering step conducted usually at 700° C. or less is preferred. For example, a single crystal substrate made of magnesium oxide, strontium titanate, or the like, a ceramic substrate made of zirconia, alumina, silica, or the like, a semiconductor substrate made of silicon (Si), tungsten (W), or the like, or a heat-resistant stainless (SUS) substrate is used preferably. Those materials may be combined in multiple kinds or may be laminated to form a multi-layered configuration. One of a conductive metal and a conductive metal oxide may be doped in a substrate or laminated on the surface of a substrate for the purpose of allowing one of the conductive metal and the conductive metal oxide to additionally function as one of the electrodes of the piezoelectric device.

Of those substrates, a silicon substrate having a conductive layer on its surface is preferable. The use of the silicon substrate having a conductive layer on its surface provides a ferroelectric thin film of a polycrystal. Since the polycrystal has a large number of randomly dispersed grain boundaries, the effect of the oxide of copper or nickel added is improved.

The lower electrode 2 and the upper electrode 4 are each formed of a conductive layer having a thickness of about 5 to 2,000 nm. A material for each of the electrodes is not particularly limited, and a material used in a ferroelectric device in ordinary cases suffices. Examples of the material include metals such as Ti, Pt, Ta, Ir, Sr, In, Sn, Au, Al, Fe, Cr, and Ni, and oxides of these metals. Each of the lower electrode 2 and the upper electrode 4 may be formed of one kind of them, or may be formed by laminating two or more kinds of them.

Those metals and oxides may each be formed on the substrate by application by the CSD method or the like and sintering, or may each be formed on the substrate by sputtering, vapor deposition, or the like. In addition, each of the lower electrode and the upper electrode may be used after having been patterned into a desired shape.

The ferroelectric thin film 3 may similarly be used in the device after having been patterned into a desired shape.

The ferroelectric device of the present invention can be used in a device such as a ferroelectric memory, a capacitor, a piezoelectric sensor, an ultrasonic vibrator, a piezoelectric actuator, or an ink-jet head.

Hereinafter, the present invention is described more specifically by way of examples. However, the present invention is not limited to the following examples.

(Production Examples 1 to 9 of Raw Material Mixed Solution)

Mixed solutions having metal molar ratios shown in Table 1 were prepared as raw material solutions for forming the ferroelectric material of the present invention. Solutions of 2-ethylhexanoates of bismuth, iron, manganese, copper, and nickel were used as the raw material compounds of the respective metals. The solutions are prepared by dissolving the 2-ethylhexanoates of the respective metals in xylene, and the solutions each have a concentration of 0.2 mol/l in terms of a metal oxide. Those metal salt solutions were mixed at a ratio shown in Table 1, and the mixture was stirred at normal temperature for 2 hours.

Each of the mixed solutions of Production Examples 1 to 9 had a difference between the total concentration of iron and manganese components and the concentration of bismuth of 1 at. % or less.

(Production Examples 10 to 16 of Raw Material Mixed Solution)

Raw material mixed solutions each having metal composition shown in Table 1 were each prepared in the same manner as in Production Example 1 for comparison with the present invention.

TABLE 1

|  | Bi (mole(s)) | Fe (mole(s)) | Mn (mole(s)) | Cu (mole(s)) | Ni (mole(s)) |
|---|---|---|---|---|---|
| Production Example 1 | 100 | 97 | 3 | 3 | 0 |
| Production Example 2 | 100 | 99 | 1 | 0 | 1 |
| Production Example 3 | 100 | 96 | 4 | 3 | 1 |
| Production Example 4 | 100 | 99.5 | 0.5 | 0.5 | 0 |
| Production Example 5 | 100 | 95 | 5 | 0 | 5 |
| Production Example 6 | 100 | 99 | 1 | 2 | 0 |
| Production Example 7 | 110 | 90 | 10 | 10 | 0 |
| Production Example 8 | 100 | 88 | 12 | 15 | 2 |
| Production Example 9 | 100 | 80 | 20 | 0 | 3 |
| Production Example 10 | 100 | 100 | 0 | 0 | 0 |
| Production Example 11 | 100 | 97 | 3 | 0 | 0 |
| Production Example 12 | 100 | 100 | 0 | 3 | 0 |
| Production Example 13 | 100 | 100 | 0 | 0 | 1 |
| Production Example 14 | 100 | 99.7 | 0.3 | 0.3 | 0 |
| Production Example 15 | 100 | 97 | 3 | 22 | 0 |
| Production Example 16 | 100 | 75 | 25 | 0 | 0 |

(Note 1)
The term "(mole(s))" in the table represents a value obtained by converting the total amount of substance (moles) of iron and manganese into 100.

EXAMPLE 1

A metal oxide thin film was formed on a substrate by a chemical solution deposition method involving the use of the raw material mixed solution of Production Example 1.

As the substrate on which the thin film is formed, a silicon substrate with an oxide film having a platinum titanium alloy with a thickness of about 100 nm on a film formation plane as a lower electrode was used.

First, the raw material mixed solution 1 was applied onto the above substrate with a spin coater (6,000 rpm). The applied layer was thermally treated under an air atmosphere. The heat treatment process was performed with a hot plate in two stages, i.e., 150° C. for 1 minute and 350° C. for 3 minutes.

After that, the application process and the heat treatment process were similarly repeated so that second to sixth layers might be formed. Finally, the entire substrate was thermally treated at 650° C. for 5 minutes so that a film might be crystallized. As a result, the ferroelectric thin film of the present invention was obtained. It should be noted that an infrared annealing furnace was used in the above heat treatment.

X-ray diffraction measurement (XRD) found that the ferroelectric thin film had a rhombohedral perovskite-type crystal structure. The thickness of the ferroelectric thin film measured with a contact displacement meter was 210 nm. That is, a coating thickness per layer is 35 nm.

The surface of the ferroelectric thin film was scanned with an atomic force microscope (AFM). As a result, a crystal grain image was obtained. A circle-equivalent average particle diameter calculated from the image was 85 nm.

Next, the content of a metal element in the ferroelectric thin film was measured by X-ray fluorescence analysis (XRF). It was found that, when the total molar amount of iron and manganese was normalized to 1, a content ratio "Bi/Fe/Mn/Cu" was 1.00/0.97/0.03/0.03.

Further, the bond energy of electrons at a depth of 50 nm was observed by X-ray photoelectron spectroscopy (XPS). As a result, it was found that a bond energy state corresponding to the 2p orbital of manganese was split and the ferroelectric thin film contained tetravalent manganese. Table 2 shows the result.

EXAMPLES 2 TO 9

Ferroelectric thin films were each formed on the substrate by using each of the raw material mixed solutions of Production Examples 2 to 9 in the same manner as in Example 1 except the number of coating layers.

XRD found that each of those ferroelectric thin films had a rhombohedral perovskite-type crystal structure.

In addition, each of the thin films was evaluated for the number of coating layers, a thickness measured with a contact displacement meter, an average particle diameter measured with an AFM, the abundance ratio of a metal element determined by XRF, and the presence or absence of tetravalent manganese. The results are as shown in Table 2.

Comparative Examples 1 to 7

A metal oxide thin film for comparison were each formed on the substrate by using each of the raw material mixed solutions of Production Examples 10 to 16 in the same manner as in Example 1.

According to XRD, the metal oxide thin films formed of the raw material mixed solutions of Production Examples 10, 11, 12, 13, and 14 each had a rhombohedral perovskite-type crystal structure, but the films formed of the raw material mixed solutions of Production Examples 15 and 16 each had so large a number of secondary phases that it was hard to say that the film was mainly formed of a perovskite-type crystal structure.

In addition, each of the thin films was evaluated for the number of coating layers, a thickness measured with a contact displacement meter, an average particle diameter measured with an AFM, the abundance ratio of a metal element determined by XRF, and the presence or absence of tetravalent manganese. The results are as shown in Table 2.

TABLE 2

|  | Raw material solution | Number of coating layers | Thickness (nm) | Average particle diameter (nm) | Bi (mole(s)) | Fe (mole(s)) | Mn (mole(s)) | Cu (mole(s)) | Ni (mole(s)) | Tetravalent manganese |
|---|---|---|---|---|---|---|---|---|---|---|
| Example 1 | Production Example 1 | 6 | 210 | 85 | 1.00 | 0.97 | 0.03 | 0.03 | 0.00 | Present |
| Example 2 | Production Example 2 | 5 | 190 | 50 | 1.00 | 0.99 | 0.01 | 0.00 | 0.01 | Present |
| Example 3 | Production Example 3 | 10 | 380 | 90 | 1.01 | 0.96 | 0.04 | 0.03 | 0.01 | Present |
| Example 4 | Production Example 4 | 20 | 820 | 100 | 0.99 | 0.99 | 0.005 | 0.005 | 0.00 | Present |
| Example 5 | Production Example 5 | 3 | 105 | 120 | 1.00 | 0.95 | 0.05 | 0.00 | 0.05 | Present |
| Example 6 | Production Example 6 | 6 | 220 | 75 | 1.00 | 0.99 | 0.01 | 0.02 | 0.00 | Present |
| Example 7 | Production Example 7 | 5 | 170 | 105 | 1.10 | 0.90 | 0.10 | 0.10 | 0.00 | Present |
| Example 8 | Production Example 8 | 5 | 165 | 115 | 1.01 | 0.88 | 0.12 | 0.15 | 0.02 | Present |
| Example 9 | Production Example 9 | 6 | 200 | 120 | 1.00 | 0.80 | 0.20 | 0.00 | 0.03 | Present |
| Comparative Example 1 | Production Example 10 | 6 | 200 | 60 | 1.00 | 1.00 | 0.00 | 0.00 | 0.00 | Absent |
| Comparative Example 2 | Production Example 11 | 6 | 195 | 40 | 1.00 | 0.97 | 0.03 | 0.00 | 0.00 | Present |
| Comparative Example 3 | Production Example 12 | 6 | 205 | 110 | 1.00 | 1.00 | 0.00 | 0.03 | 0.00 | Absent |
| Comparative example 4 | Production Example 13 | 6 | 210 | 60 | 0.99 | 1.00 | 0.00 | 0.00 | 0.01 | Absent |

TABLE 2-continued

| | Raw material solution | Number of coating layers | Thickness (nm) | Average particle diameter (nm) | Bi (mole(s)) | Fe (mole(s)) | Mn (mole(s)) | Cu (mole(s)) | Ni (mole(s)) | Tetravalent manganese |
|---|---|---|---|---|---|---|---|---|---|---|
| Comparative Example 5 | Production Example 14 | 6 | 195 | 55 | 1.10 | 1.00 | 0.001 | 0.003 | 0.00 | Absent |
| Comparative Example 6 | Production Example 15 | 6 | 190 | 150 | 1.00 | 0.97 | 0.03 | 0.21 | 0.00 | Present |
| Comparative Example 7 | Production Example 16 | 6 | Unable to evaluate | Unable to evaluate | 1.10 | 0.76 | 0.24 | 0.00 | 0.00 | Absent |

(Note 2)
A chemical formula for each of the metal oxides of Examples 1 to 9 and Comparative Examples 1 to 7 in the table is shown below.

The metal oxides are each represented by a chemical formula "$Bi(Fe_{1-x}Mn_x)O_3+yCuO+zNiO$." Examples 1 to 9 each satisfy the ranges of $0.005 \leq x \leq 0.20$ and $0.005 \leq y+z \leq 0.20$, and Comparative Examples 1 to 7 each deviate from the above ranges. It should be noted that, as described above, the parts "+yCuO" and "+zNiO" mean that CuO or NiO is added.

(Production of Devices from Examples 1 to 3 and 9)

A platinum electrode having a diameter of 370 μm was provided on the surface of each of the ferroelectric thin films of the present invention corresponding to Examples 1, 2, 3, and 9 by a sputtering method. As a result, the ferroelectric devices of the present invention were produced.

Comparative Examples 1, 2, and 5

A platinum electrode having a diameter of 370 μm was provided on the surface of each of the metal oxide thin films for comparison corresponding to Comparative Examples 1, 2, and 5 by a sputtering method. As a result, devices for comparison were produced.

None of the metal oxide thin films of Comparative Examples 3, 4, 6, and 7 was turned into a device because each of the films showed a tester leak.

(Evaluation by Electric Measurement)

Table 3 shows the results of electric measurement conducted on the ferroelectric devices of Examples 1, 2, 3, and 9, and the devices of Comparative Examples 1, 2, and 5. Each of the devices was measured for values representing the characteristics of a ferroelectric material at room temperature (25° C.), i.e., a leak current, a remanent polarization, a coercive electric field, a dielectric constant, and a dielectric loss.

The leak current was determined by measuring a leak current in such a range that an applied voltage per thickness of a thin film interposed between electrodes was ±1,000 kV/cm, to thereby record the maximum leak current. The voltage was applied according not to a sweep mode but to a pulse mode.

The remanent polarization and the coercive electric field were determined by P-E hysteresis measurement. That is, a hysteresis curve peculiar to a ferroelectric material was observed, the curve showing that spontaneous polarization was inverted by changing the magnitude of an external electric field applied to the ferroelectric device of the present invention positively and negatively. When no ferroelectricity was observed, the mark "x" was recorded. When ferroelectricity was observed, a remanent polarization Pr and a coercive electric field Ec read off the hysteresis curve were recorded.

In an application such as a ferroelectric memory, it is desired that the Pr be large and the Ec be small.

The dielectric constant and the dielectric loss were measured with an impedance analyzer. Numerical values at 1 kHz were used for the dielectric constants and the dielectric losses shown in Table 3. All the dielectric constants described herein were relative permittivity relative to a vacuum dielectric constant. In addition, the other examples were each similarly evaluated for the characteristics, and were observed to be superior in the characteristics to the comparative examples.

TABLE 3

| | Leak current (A/cm2) | Remanent polarization (μC/cm2) | Coercive electric field Ec (kV/cm) | Dielectric constant | Dielectric loss |
|---|---|---|---|---|---|
| Example 1 | $5.0 \times 10^{-3}$ | 74 | 270 | 180 | 0.02 |
| Example 2 | $4.1 \times 10^{-3}$ | 65 | 250 | 170 | 0.04 |
| Example 3 | $7.0 \times 10^{-3}$ | 80 | 230 | 270 | 0.06 |
| Example 9 | $7.2 \times 10^{-3}$ | 34 | 350 | 120 | 0.09 |
| Comparative Example 1 | $2.0 \times 10^{0}$ | x | x | 150 | 0.21 |
| Comparative Example 2 | $4.5 \times 10^{-3}$ | 26 | 400 | 80 | 0.03 |
| Comparative Example 5 | $1.7 \times 10^{0}$ | x | x | 160 | 0.17 |

According to Table 3, each of all the ferroelectric devices of the present invention showed ferroelectricity, but each of the devices of Comparative Examples 1 and 5 was poor in insulation property and its ferroelectricity could not be observed.

Figure 2:
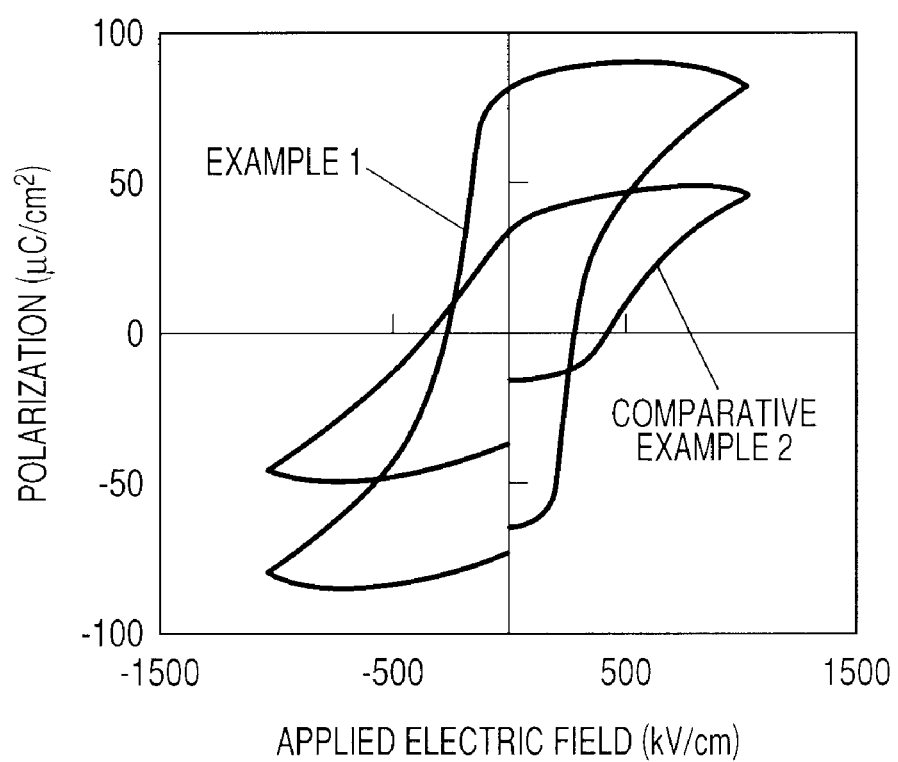
FIG. 2 is a graph illustrating an example of the P-E hysteresis curve of each of the ferroelectric device of the present invention produced in Example 1 and a device produced in Comparative Example 2.

FIG. 2 illustrates a P-E hysteresis curve when an electric field of a maximum of ±1,000 kV/cm was applied to each of the ferroelectric device of Example 1 and the device of Comparative Example 2. As can be seen from FIG. 2, the ferroelectric devices of the present invention each have excellent performance as, for example, a memory device because the ferroelectric devices each have a large remanent polarization and a small coercive electric field.

The ferroelectric material of the present invention is also applicable to an MEMS technique and is clean to the environment. Therefore, the ferroelectric material of the present invention can be used for appliances using many ferroelectric materials, such as a ferroelectric memory, a thin film piezo-type ink jet head, and an ultrasonic motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-035839, filed Feb. 18, 2009, which is hereby incorporated reference herein in its entirety.

What is claimed is:

1. A ferroelectric material comprising a metal oxide, wherein
the metal oxide contains bismuth ferrite whose iron is substituted by manganese, and at least one of a copper oxide and a nickel oxide; iron of the bismuth ferrite is substituted by manganese at a substitution ratio of 0.5 at.

% or more to 20 at. % or less with respect to a total amount of iron and manganese; and at least one of the copper oxide and the nickel oxide is added in an amount of 0.5 mol % or more to 20 mol % or less with respect to the bismuth ferrite whose iron is substituted by manganese.

2. The ferroelectric material according to claim 1, wherein the substitution ratio of manganese is 1 at. % or more to 5 at. % or less with respect to the total amount of iron and manganese.

3. The ferroelectric material according to claim 1, wherein the addition amount of at least one of the copper oxide and the nickel oxide is 1 mol % or more to 5 mol % or less with respect to the bismuth ferrite whose iron is substituted by manganese.

4. The ferroelectric material according to claim 1, wherein manganese contains tetravalent manganese.

5. The ferroelectric material according to claim 1, wherein the metal oxide comprises a polycrystal.

6. The ferroelectric material according to claim 1, wherein the ferroelectric material forms a thin film.

7. The ferroelectric material according to claim 6, wherein an average particle diameter of crystal grains when the ferroelectric material is observed from a film surface is 50 nm or more to 120 nm or less.

8. The ferroelectric material according to claim 6, wherein the ferroelectric material has a thickness of 50 nm or more to 4,000 nm or less.

9. A ferroelectric device obtained by interposing the ferroelectric material according to claim 6 with a pair of electrodes.

10. A method of producing a ferroelectric material formed of a metal oxide, the metal oxide containing bismuth ferrite whose iron is substituted by manganese, and at least one of a copper oxide and a nickel oxide, iron of the bismuth ferrite being substituted by manganese at a substitution ratio of 0.5 at. % or more to 20 at. % or less with respect to a total amount of iron and manganese, and at least one of the copper oxide and the nickel oxide being added in an amount of 0.5 mol % or more to 20 mol % or less with respect to the bismuth ferrite whose iron is substituted by manganese, the ferroelectric material forms a thin film, the method comprising forming the thin film with a mixed solution of metal salts of bismuth, iron, manganese, and at least one of copper and nickel by a chemical solution deposition method.

11. The method of producing a ferroelectric material according to claim 10, wherein the metal salt comprises 2-ethylhexanoates.

12. The method of producing a ferroelectric material according to claim 10, wherein a difference between a total amount of iron and manganese in the mixed solution of the metal salts and a content of bismuth in the solution is 1 at. % or less.

13. The method of producing a ferroelectric material according to claim 10, wherein the chemical solution deposition method is based on multi-layer coating, and a coating thickness per layer is 10 nm or more to 50 nm or less.

* * * * *